United States Patent
Regau

(10) Patent No.: US 10,175,290 B2
(45) Date of Patent: Jan. 8, 2019

(54) OPTOELECTRONIC ASSEMBLY AND METHOD FOR OPERATING AN OPTOELECTRONIC ASSEMBLY

(71) Applicant: OSRAM OLED GmbH, Regensburg (DE)

(72) Inventor: Kilian Regau, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/543,580

(22) PCT Filed: Jan. 13, 2016

(86) PCT No.: PCT/EP2016/050559
§ 371 (c)(1),
(2) Date: Jul. 14, 2017

(87) PCT Pub. No.: WO2016/113301
PCT Pub. Date: Jul. 21, 2016

(65) Prior Publication Data
US 2017/0370983 A1    Dec. 28, 2017

(30) Foreign Application Priority Data

Jan. 16, 2015   (DE) .......... 10 2015 100 605

(51) Int. Cl.
*G01R 31/02* (2006.01)
*H05B 33/08* (2006.01)
*G01R 31/26* (2014.01)

(52) U.S. Cl.
CPC ....... *G01R 31/2635* (2013.01); *G01R 31/025* (2013.01); *H05B 33/0827* (2013.01); *H05B 33/0887* (2013.01); *H05B 33/0896* (2013.01)

(58) Field of Classification Search
CPC .... G01R 31/02; G01R 31/025; G01R 31/028; G01R 31/26; G01R 31/2635; G01R 31/28;
(Continued)

(56) References Cited

U.S. PATENT DOCUMENTS

2011/0204792 A1* 8/2011 Siegmund .......... H05B 33/0896
                                              315/119
2012/0127213 A1    5/2012 Park
(Continued)

FOREIGN PATENT DOCUMENTS

DE   10 2014 112 171 A1    2/2015
EP          2741583 A1    6/2014
(Continued)

OTHER PUBLICATIONS

International Search Report based on application No. PCT/EP2016/050559 (5 pages + 2 pages English translation) dated May 11, 2016 (for reference purpose only).

(Continued)

*Primary Examiner* — Thai Pham
(74) *Attorney, Agent, or Firm* — Viering, Jentschura & Partner MBB

(57) ABSTRACT

According to the present disclosure, an optoelectronic assembly is disclosed with at least one optoelectronic component, and a sensor circuit. The sensor circuit includes at least one energy supply circuit and an ascertainment circuit having at least one energy storage unit and a detection unit. The ascertainment circuit and the at least one optoelectronic component are electrically connected to one another in parallel. The at least one energy supply circuit is configured to supply electrical energy to the at least one optoelectronic component and the energy storage unit. The energy stored in the energy storage unit is supplied independently of the (Continued)

electrical energy supplied to the at least one optoelectronic component. The ascertainment circuit is configured such that the detection unit detects a change of the electrical energy stored in the energy storage unit depending on a change of the energy stored in the at least one optoelectronic component.

18 Claims, 9 Drawing Sheets

(58) Field of Classification Search
CPC .. H05B 33/28; H05B 33/0896; H05B 33/824; H05B 33/0884; H05B 37/02; H05B 33/08
See application file for complete search history.

(56) References Cited

U.S. PATENT DOCUMENTS

2012/0262070 A1* 10/2012 Oshima .............. H05B 33/0887
                                                    315/130
2013/0106288 A1   5/2013 Hente

FOREIGN PATENT DOCUMENTS

WO        2010060458 A1    6/2010
WO        2012004720 A2    1/2012

OTHER PUBLICATIONS

German Search Report based on application No. 10 2015 100 605.7 (10 pages) dated Jul. 24, 2015 (for reference purpose only).

* cited by examiner

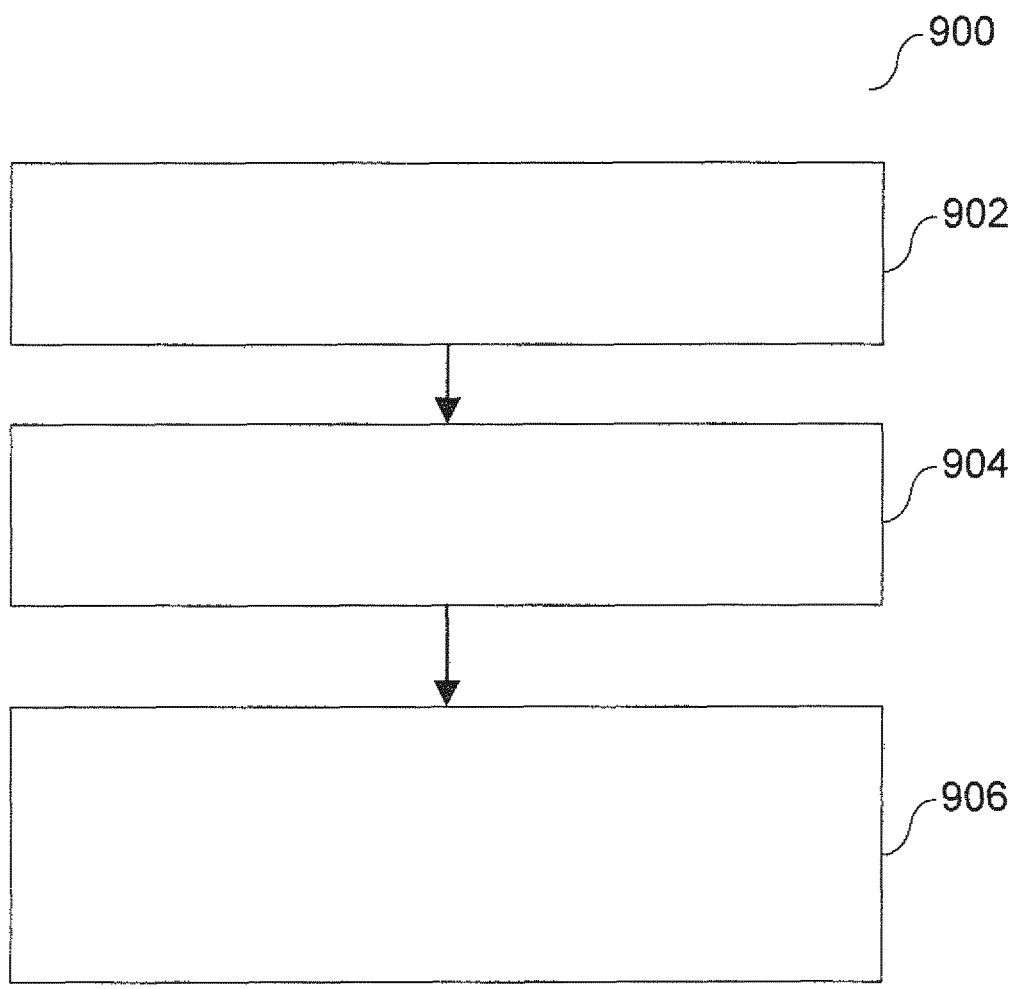

OPTOELECTRONIC ASSEMBLY AND METHOD FOR OPERATING AN OPTOELECTRONIC ASSEMBLY

RELATED APPLICATIONS

The present application is a national stage entry according to 35 U.S.C. § 371 of PCT application No.: PCT/EP2016/050559 filed on Jan. 13, 2016, which claims priority from German application No.: 10 2015 100 605.7 filed on Jan. 16, 2015, and is incorporated herein by reference in its entirety.

TECHNICAL FIELD

The present disclosure relates to an optoelectronic assembly and a method for operating an optoelectronic assembly.

BACKGROUND

An optoelectronic assembly may include, for example, one, two, or more light-emitting diode elements. The light-emitting diode elements can be, for example, light-emitting diodes (LEDs) and/or organic light-emitting diodes (OLEDs) or parts or segments of light-emitting diodes (LEDs) or organic light-emitting diodes (OLEDs), respectively.

In spite of complex quality controls of light-emitting diode elements, it is not possible to completely preclude the spontaneous failure of the light-emitting diode elements in use. For example, in the case of an OLED, a typical fault picture for a spontaneous failure is a short-circuit (short) between the electrodes of the corresponding light-emitting diode element. A short-circuit of the electrodes of the light-emitting diode element intrinsically short-circuits or discharges the parasitic capacitance of the light-emitting diode element. Such a short-circuit typically has a small area. Therefore, a majority of the total current is concentrated in the small-area short-circuit point. The current density is therefore significantly superelevated in the short-circuit point, whereby this short-circuit point can heat up strongly depending on its area extension. This can result in fusing of the electrodes, dark spots in the light image of the OLED, a completely dark OLED, and/or a point which becomes hot on the OLED.

To avoid a potential hazard due to this overheating (hazard of combustion, fire, bursting, etc.), such a short-circuit should be recognized by driver electronics of the optoelectronic assembly and a suitable protective reaction should be initiated (shutdown of the OLED or the optoelectronic assembly, redirection of the supply current around the short-circuited OLED, output of a warning signal, etc.). For example, in the automotive field, it is required that defective OLEDs or LEDs, for example, in taillights, are electronically recognized and reported at least to the vehicle electrical system.

A routine interconnection of light-emitting diode elements, for example, OLEDs, of an optoelectronic assembly in use is, for technical reasons and reasons of cost, the series circuit of the light-emitting diode elements. For example, multiple light-emitting diode elements in a light-emitting diode can be connected in series and/or multiple light-emitting diodes can be connected in series. For many uses, for example, in the automotive field or in the field of general illumination, therefore, multiple light-emitting diode elements are electrically connected in series. If individual defective light-emitting diode elements in a series circuit are intended to be recognized using simple methods, this represents a special challenge.

Methods for ascertaining short-circuits of individual OLEDs are known from US 2011 204 792 A1, WO 2010 060 458 A1, and WO 2012 004 720 A2, in which an overvoltage or undervoltage at the corresponding OLED is used as a criterion for a defect. The recognition of the short-circuit is reacted to with a redirection of the activation current (bypassing) and/or with a fault signal generation.

In the field of general illumination, it is typical that flexible control devices have a variable output voltage range. A variable number of light-emitting diode elements can thus be connected to the control devices.

SUMMARY

Further methods for ascertaining short-circuits of individual light-emitting diode elements can have disadvantages in certain applications, for example, by the methods requiring that the light-emitting diode elements be charged, before the test for short-circuits, briefly to a voltage which is greater than the threshold voltage of the light-emitting diode elements, then be shut down, and subsequently the voltage or a discharge current be measured. However, this requires that the light-emitting diode elements are briefly started up and then shut down again for the test. This can be undesirable depending on the use, for example, in the case of a short-circuit test before the start of a motor vehicle and before the light is turned on. In such motor vehicle applications, the brief illumination of the light during the short-circuit test is undesirable, for example. Alternatively, the short-circuit test can be carried out briefly during the operation of the light-emitting diode element. However, this requires a brief shutdown of the light-emitting diode element. The brief shutdown can be kept as short as possible, so that the short-circuit test is not visible. However, such a shutdown can also be undesirable depending on the use. Alternatively, the short-circuit test can be carried out during the shutdown of the optoelectronic component. However, this can be undesirable depending on the use, because in this case the short-circuit recognition can occur excessively late.

Another object of the present disclosure is to provide an optoelectronic assembly which enables: a short-circuit of an individual optoelectronic component of the optoelectronic assembly to be reliably recognized, a short-circuit of an optoelectronic component in a series and/or parallel circuit of optoelectronic components of the optoelectronic assembly to be reliably recognized, and a minimization of a disturbing influence of aging and/or temperature on the recognition of the short-circuit.

The object of the present disclosure is to provide a method for operating an optoelectronic assembly, which enables: a short-circuit of an individual optoelectronic component of the optoelectronic assembly to be reliably recognized, a short-circuit of an optoelectronic component in a series and/or parallel circuit of optoelectronic components of the optoelectronic assembly to be reliably recognized, and a minimization of a disturbing influence of aging and/or temperature on the recognition of the short-circuit.

The object is achieved according to one aspect of the present disclosure by an optoelectronic assembly, which includes: at least one optoelectronic component and a sensor circuit. The sensor circuit includes at least one energy supply circuit and an ascertainment circuit. The ascertainment circuit includes at least one energy storage unit and a detection unit. The ascertainment circuit and the at least one optoelectronic component are electrically connected to one another in parallel. The at least one energy supply circuit is configured to supply electrical energy to the at least one optoelectronic component and the energy storage unit, wherein the energy stored in the energy storage unit is supplied independently of the electrical energy supplied to the at least one optoelectronic component. The ascertainment circuit is configured such that the detection unit detects a change of the electrical energy stored in the energy storage unit depending on a change of the energy stored in the at least one optoelectronic component.

A change of the stored energy can be ascertained by means of a detection of the stored energy at at least one first time and one second time and an ascertainment of the difference of the stored energy at the second time in relation to the first time. This means a relative change of the stored energy can be detected.

A change of the stored energy can also be a deviation with respect to a predefined target value, which is ascertained by means of a detection of the stored energy and an ascertainment of the difference of the detected energy with respect to the predefined value, for example, of a reference component or a stored value. This means an absolute change or deviation from a predefined value can be detected.

The change of the energy stored in the energy storage unit is detectable by means of the detection unit. The change of the energy stored in the energy storage unit differs significantly in a partial circuit having at least one optoelectronic component without short-circuit from a partial circuit having at least one optoelectronic component with short-circuit. The fact that the short-circuit exists in the optoelectronic partial circuit means that one of the optoelectronic components in the optoelectronic partial circuit includes the short-circuit.

The optoelectronic assembly enables the implementation of a novel, simple, and cost-effective method to check OLEDs for short-circuits in the application even before they are turned on and/or during operation. In addition, multiple partial circuits having optoelectronic components can be monitored simultaneously in parallel using the optoelectronic assembly.

As a reaction to the recognition of the short-circuit, for example, the driver circuit can shut down or be shut down, a warning signal can be generated and conducted to a higher-order unit, for example, a computer unit, for example, an onboard computer of a motor vehicle, and/or the short-circuited optoelectronic component can be electrically bypassed. This can be of interest, for example, in the automotive field and/or in the field of general illumination, for example, in the consumer field, for example, in a hand-held lamp having a single organic light-emitting diode.

It is additionally enabled by means of the optoelectronic assembly that the signals of the detection unit can or may be chronologically independent of the signals of the driver circuits, i.e., uncorrelated or asynchronous. The test of the at least one optoelectronic component for short-circuits can be executed by means of the ascertainment circuit without chronological synchronization with the operating circuit. The driver circuit is, for example, an energy source or a control device. In addition, it is enabled that the voltage which drops over the at least one optoelectronic partial circuit having at least one optoelectronic component is not detected, ascertained, or measured directly at the optoelectronic partial circuit. Therefore, independent, cost-effective electronic units can be constructed.

The optoelectronic assembly according to various refinements enables economically, cost-effective analog circuits, for example, without a microcontroller.

With suitable design of the component parts of a light-emitting optoelectronic assembly, the at least one light-emitting optoelectronic component is optically inactive during the test. The test can thus be carried out without influencing the appearance of the optoelectronic assembly.

Before the testing of the at least one optoelectronic component for short-circuits, in addition, it is not necessary to energize the optoelectronic component or the at least one optoelectronic partial circuit.

The sensor circuit can additionally, in the event of a pulse-modulated activation of the at least one optoelectronic component in off states, test the at least one optoelectronic component automatically (without active activation) for short-circuits.

In one refinement, the at least one optoelectronic component is an organic light-emitting diode.

In one refinement, the energy storage unit includes at least one capacitor. The detection unit includes at least one voltmeter. The voltmeter can be electrically connected in parallel to at least one capacitor of the energy storage unit.

This enables a simple and cost-effective detection of the energy storable in the at least one optoelectronic component.

In one refinement, the ascertainment circuit includes a blocking unit, which is arranged in the current path between the energy storage unit and the at least one optoelectronic component.

This enables coupling and decoupling of the ascertainment circuit to and from the energizing of the at least one optoelectronic component.

In one refinement, the optoelectronic assembly furthermore includes at least one control device, for example, a linear regulator, a clocked regulator, or a switch, for regulating or controlling the energy supplied to the at least one optoelectronic component.

This enables, for example, that for a pulse-modulated activation of the at least one optoelectronic component, a simpler and/or more robust energy source can be used. Alternatively or additionally, the energy source can be used as a current regulator for the optoelectronic partial circuit.

In one refinement, the optoelectronic assembly includes at least one first optoelectronic partial circuit having at least one optoelectronic component and one second optoelectronic partial circuit having at least one optoelectronic component, wherein the first optoelectronic partial circuit is electrically connected in parallel to the second optoelectronic partial circuit.

In one refinement, the optoelectronic assembly includes at least one optoelectronic partial circuit having a first optoelectronic component and a second optoelectronic component, which are electrically connected to one another in series.

In one refinement, the energy storage unit and the energy supply circuit are designed such that the electrical voltage which drops over the energy storage unit is less than or is approximately equal to the total threshold voltage of the optoelectronic components, which are electrically connected to one another in series and are electrically conductively connected to the energy storage unit. The electrical voltage which drops over the energy storage unit can additionally be less than or approximately equal to the total threshold voltage and the voltage which drops over a blocking unit and/or a control device, which are arranged in the current path of the energy storage unit and the electrically conductively connected optoelectronic components.

In one refinement, the energy storage unit and the energy supply circuit are designed such that the electrical voltage which drops over the energy storage unit is greater than or is approximately equal to the total threshold voltage of the optoelectronic components which are electrically connected to one another in series and are electrically conductively connected to the energy storage unit, wherein at least one of the electrically conductively connected optoelectronic components includes an electrical short-circuit.

A short-circuited optoelectronic component has a threshold voltage of approximately 0 V. The electrical voltage which drops over the energy storage unit is therefore greater than or approximately equal to the total threshold voltage of the intact optoelectronic components. The electrical voltage which drops over the energy storage unit is thus greater for the case in which at least one optoelectronic component is short-circuited than the voltage which drops over the intact optoelectronic components and the at least one short-circuited optoelectronic component. After shutdown of the energizing of the optoelectronic components, a change of the energy stored in the energy storage unit can thus be detected.

For example, the electrical voltage which drops over the energy storage unit can be set such that the sensor circuit first detects electrical short-circuits when a predefined number of optoelectronic components, for example, two or more optoelectronic components, are electrically short-circuited.

In one refinement, the optoelectronic assembly furthermore includes an analysis unit, which is configured to ascertain, depending on the detected change of the energy stored in the energy storage unit, whether the at least one optoelectronic component includes a short-circuit.

The object is achieved according to a further aspect of the present disclosure by a method for operating an optoelectronic assembly. The method includes supplying electrical energy to the energy storage unit by means of the energy supply circuit. The method furthermore includes detecting the stored electrical energy in the energy storage unit by means of the detection unit. The method additionally includes ascertaining a change of the stored electrical energy detected in the energy storage unit with respect to a predefined value.

The predefined value is, for example, the stored energy at another time, the voltage drop with respect to a reference component, or a value stored in an analysis unit.

The method can be executed on the above-explained optoelectronic assembly. The advantages and refinements mentioned with reference to the optoelectronic assembly can be readily transferred to corresponding advantages and refinements of the method. The energy supply circuit can be, for example, a driver circuit, can be referred to as a driver circuit, or can be a part of a driver circuit.

According to one refinement, the detected stored energy of the first time is compared to a predefined target value, which is greater than zero. It is recognized that at least one optoelectronic component includes a short-circuit at the first time if the energy which is detected at the first time and is stored in the energy storage unit is less than the predefined target value. It is recognized that no optoelectronic component includes a short-circuit if the energy which is detected at the first time and is stored in the energy storage unit is equal or at least approximately equal to the predefined target value. This contributes to recognizing the short-circuit in a simple manner, if the optoelectronic partial circuit and/or the optoelectronic assembly include two, three, or more optoelectronic components. The predefined target value can correspond, for example, to the threshold voltage, threshold value voltage, or forward voltage of the intact components which are collectively electrically connected in series to the energy storage unit, when the energy supply circuit is decoupled. The target value can be empirically ascertained, stored, and then predefined, for example.

According to one refinement, the electrical connection of the energy storage unit to the at least one optoelectronic component is interrupted by means of a blocking unit of the ascertainment circuit if energy is supplied to the at least one optoelectronic component directly from the energy supply circuit, wherein the blocking unit is arranged in the current path between the energy storage unit and the at least one optoelectronic component.

The electrical connection can be interrupted, for example, by electrically conductively connecting the at least one optoelectronic component to the energy supply circuit and/or interrupting the electrical connection of the energy storage unit to the at least one optoelectronic component.

This enables the ascertainment circuit to be coupled to or decoupled from the at least one optoelectronic component.

According to one refinement, the optoelectronic assembly includes at least one partial circuit having a single optoelectronic component and the energy stored in the energy storage unit is predefined so that the voltage which drops over the energy storage unit is less than essentially the threshold value voltage of the optoelectronic component. The voltage which drops over the energy storage unit is also greater than zero, however.

According to one refinement, the optoelectronic assembly includes at least one partial circuit having a first optoelectronic component and a second optoelectronic component, which are electrically connected to one another in series, and the energy stored in the energy storage unit is predefined so that the voltage which drops over the energy storage unit is less than essentially the total threshold value voltage of the at least one first optoelectronic component and second optoelectronic component and is greater than essentially the threshold value voltage of at least the first optoelectronic component or the second optoelectronic component.

This enables the ascertainment of at least one short-circuit in the first optoelectronic component and/or the second optoelectronic component.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 9 shows a flow chart for a method for operating an optoelectronic assembly.

DETAILED DESCRIPTION

Figure 1:
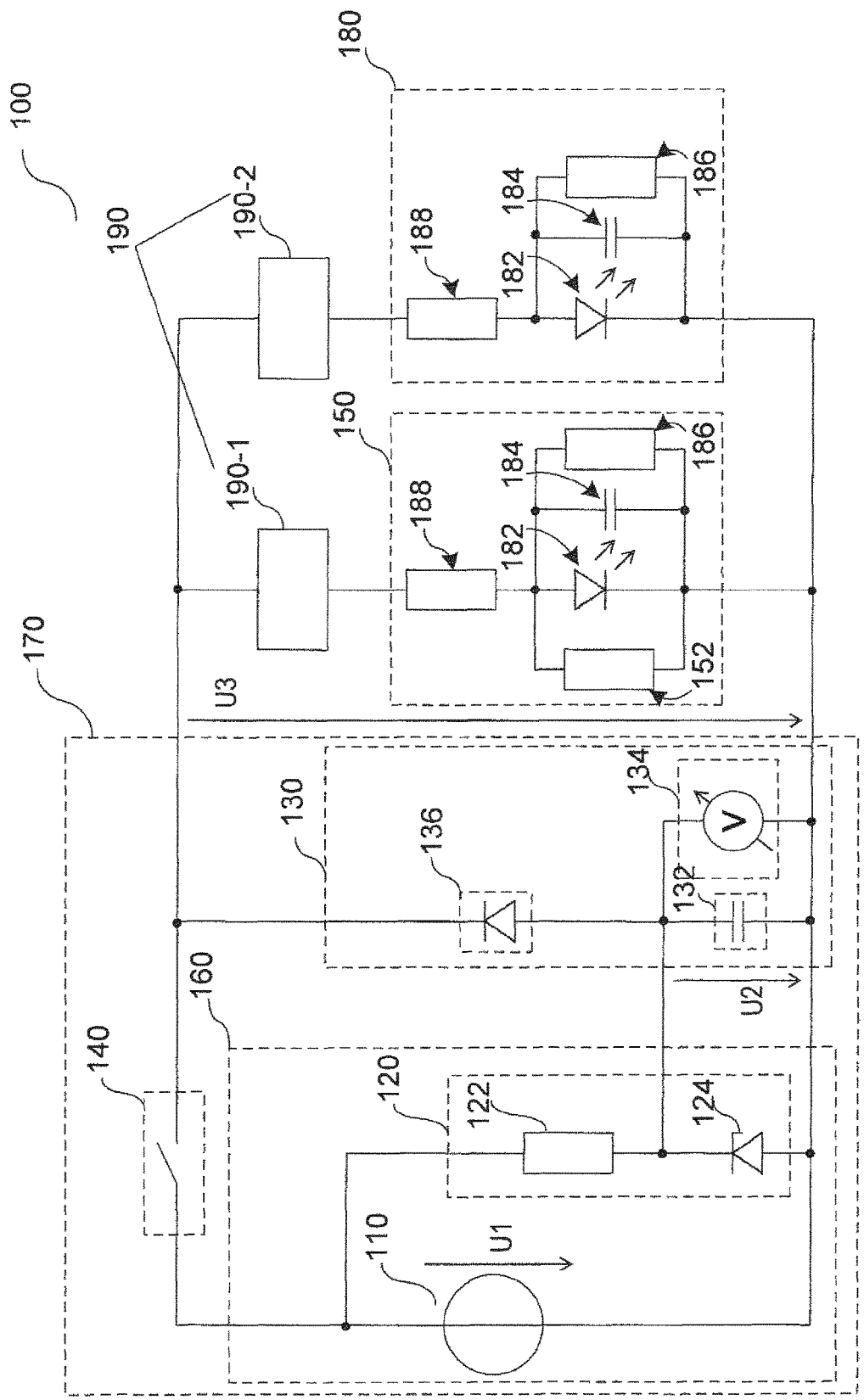
FIG. 1 shows a circuit diagram of an embodiment of an optoelectronic assembly.

In the following comprehensive description, reference is made to the appended drawings, which form a part of this description and in which specific embodiments are shown for illustration, in which the present disclosure can be carried out. In this regard, directional terminology such as "above", "below", "front", "rear", "forward", "back", etc. is used with reference to the orientation of the described figure(s). Because components of embodiments can be positioned in a number of different orientations, the directional terminology is used for illustration and is in no way restrictive. It is apparent that other embodiments can be used and structural or logical changes can be performed without deviating from the scope of protection of the present disclosure. It is apparent that the features of the various embodiments described herein can be combined with one another, if not specifically indicated otherwise. The following comprehensive description is therefore not to be interpreted in a restrictive manner, and the scope of protection of the present disclosure is defined by the appended claims.

In the context of this description, the terms "connected", "attached", or "coupled" are used to describe both a direct and also an indirect connection, a direct or indirect attachment, and a direct or indirect coupling. Identical or similar elements are provided with identical reference signs in the figures, if reasonable.

An optoelectronic assembly may include one, two, or more optoelectronic components. Optionally, an optoelectronic assembly can also include one, two, or more electronic components. An electronic component may include, for example, an active and/or a passive component. An active electronic component may include, for example, a computer, control and/or regulating unit, and/or a transistor. A passive electronic component may include, for example, a capacitor, a resistor, a diode, or a coil.

An optoelectronic component can be a component emitting electromagnetic radiation or a component absorbing electromagnetic radiation. A component absorbing electromagnetic radiation can be, for example, a solar cell or a photodetector. A component emitting electromagnetic radiation can be, in various embodiments, a semiconductor component emitting electromagnetic radiation and/or be designed as a diode emitting electromagnetic radiation, as an organic diode emitting electromagnetic radiation, as a transistor emitting electromagnetic radiation, or as an organic transistor emitting electromagnetic radiation. The radiation can be, for example, light in the visible range, UV light, and/or infrared light. In this context, the component emitting electromagnetic radiation can be designed, for example, as a light-emitting diode (LED), as an organic light-emitting diode (OLED), as a light-emitting transistor, or as an organic light-emitting transistor. The light-emitting component can be part of an integrated circuit in various embodiments. Furthermore, a plurality of light-emitting components can be provided, for example, housed in a common housing.

An optoelectronic component includes an intrinsic capacitance and an intrinsic electrode resistance. Greatly varying types of optoelectronic components can be arranged in an optoelectronic partial circuit. Partial circuits which are arranged electrically in parallel to one another may include identical or different optoelectronic components, in equal or different numbers.

FIG. 1 shows a schematic circuit diagram of an optoelectronic assembly according to various embodiments. The circuit diagram shown in FIG. 1 illustrates an optoelectronic assembly 100 having a cost-effective topology, which is desired and/or necessary in automotive applications, for example.

The optoelectronic assembly 100 includes at least one optoelectronic component 150, 180 and a sensor circuit 170.

The sensor circuit 170 includes at least one energy supply circuit 160 and an ascertainment circuit 130.

In various refinements, the energy supply circuit 160 may include an electrical energy source 110 and an energy supply partial circuit 120.

The energy supply circuit 160 includes a first terminal and a second terminal.

The energy supply circuit 160 is configured to supply electrical energy to the at least one optoelectronic component 150, 180 and the energy storage unit 132, wherein the energy stored in the energy storage unit 132 is supplied independently of the electrical energy supplied to the at least one optoelectronic component 150, 180, for example, by means of the energy supply partial circuit 120.

However, the energy supply circuit 160 can also be designed such that the electrical energy source 110 and the energy supply partial circuit 120 are free of a direct electrical connection, for example, in the form of electrical components which are not electrically connected to one another. This means the energy storage unit 132 is supplied by the energy supply partial circuit 120 and the at least one optoelectronic component 150, 180 is supplied by the energy source 110. Hereafter, the energy supply partial circuit 120 is described as electrically connected to the energy source 110 solely to simplify the description.

The energy supply partial circuit 120 is electrically connected, for example, to the energy source 110. The energy supply circuit 160 is configured such that the energy supplied to the sensor circuit, i.e., the energy supply of the sensor circuit, is adjustable, for example, depending on the number of the optoelectronic components or optoelectronic partial circuits which are switched or are to be switched to optically active.

The electrical energy source 110 is, for example, an energy source typical for the optoelectronic assembly, for example, a power supply unit or a ballast device. The energy source 110 includes a first terminal and a second terminal.

The first terminal of the energy supply circuit 160 can be identical to the first terminal of the energy source. The second terminal of the energy supply circuit 160 can be identical to the second terminal of the energy source or can be electrically connected to ground. The energy source 110 is configured to provide a voltage U1 and an electrical current, wherein the voltage U1 is applied over the first terminal and the second terminal of the energy source 110. The second terminal can be at ground, for example.

The energy supply partial circuit 120 includes an input, a first output, and a second output. The input of the energy supply partial circuit 120 is connected to the first terminal of the electrical energy source 110 and the first output of the energy supply partial circuit 120 is electrically connected to the second terminal of the electrical energy source 110 or to ground. The second output of the energy supply partial circuit 120 is electrically connected to the input of the energy storage unit 132.

The energy supply partial circuit 120 is configured such that a predefined amount of energy is supplied to the energy storage unit 132 and after the supply of the predefined amount of energy, the supply is interrupted, for example, by means of a third blocking unit, as described in greater detail hereafter.

The ascertainment circuit 130 includes at least one energy storage unit 132 and a detection unit 134.

The ascertainment circuit 130 and the at least one optoelectronic component 150, 180 are electrically connected to one another in parallel, for example, with respect to the energy source 110 or the energy supply circuit 160. The ascertainment circuit 130 is configured such that the detection unit 134 detects a change of the electrical energy stored in the energy storage unit 132 depending on a change of the energy stored in the at least one optoelectronic component 150, 180.

The energy storage unit 132 is charged with energy by the voltage U1 of the energy supply circuit 160, so that the voltage U2 drops over the energy storage unit 136.

In one refinement, the energy storage unit 132 includes at least one capacitor, over which the voltage U2 drops and in which electrical energy is stored.

In one refinement, the detection unit 134 includes at least one voltmeter. The voltmeter is, for example, electrically connected in parallel to at least one capacitor of the energy storage unit 132. A change of the energy stored in the capacitor can thus be detected.

In one refinement, a ground-related voltage U2 is detected by the detection unit 134, i.e., U2 relates to ground.

The at least one optoelectronic component or the at least one optoelectronic partial circuit includes an input and an output. At least one optoelectronic component can also be referred to as at least one optoelectronic partial circuit 180 having at least one optoelectronic component. An optoelectronic component includes a threshold voltage, also referred to as a forward voltage or threshold value voltage, from which the optoelectronic component is optically active, i.e., for example, is light-emitting or generates a significant current or a measurement signal. The threshold voltage of an optoelectronic partial circuit having multiple optoelectronic components electrically connected in series results from the total of the individual threshold voltages of the optoelectronic components electrically connected in series.

In various refinements, the at least one optoelectronic component is an organic light-emitting diode.

Solely for illustration of the action principle of the optoelectronic assembly according to various refinements, an optoelectronic assembly 100 is described in the following description, which includes an intact optoelectronic component 180 and an electrically short-circuited optoelectronic component 150, which are electrically connected to one another in parallel for the illustrated case, as illustrated in FIG. 1.

An organic optoelectronic component, for example, an organic light-emitting diode (OLED) includes an organic functional layer system (organics) having at least one emitter layer having a colorant and/or phosphor between a first electrode layer and an electrode layer. At least one of the electrode layers is formed as transparent to visible light, for example, from a transparent conductive oxide (TCO), for example, indium tin oxide (ITO). In an optoelectronic component which is optically active on one side, the electrode layer of the optically inactive side is conventionally formed as highly electrically conductive, for example, as an Ag or AgMg layer. The electrical resistance of this highly electrically conductive electrode layer is negligibly small.

An intact optoelectronic component 180 can therefore be illustrated in an equivalent circuit diagram as a series circuit of the electrical resistance 188 ($R_{ITO}$) of the transparent electrode layer and the electrical properties of the organics. The organics can be illustrated in an equivalent circuit diagram (for example, illustrated in FIG. 1) as a parallel circuit of an optically active diode 182, a capacitor 184, and an electrical bulk resistance 186 ($R_{bulk}$), which are electrically connected in series to the electrical resistance 188 of the transparent electrode layer. The capacitor 184 is formed from the parasitic capacitance of the layer structure of the optoelectronic component similarly to a plate capacitor. The bulk resistance 186 is dependent on the construction of the organics and the electrical conductivity thereof.

In an optoelectronic partial circuit having intact optoelectronic component(s), i.e., if a short-circuit is not present at any optoelectronic component of the optoelectronic partial circuit, the voltage drop U3 over the optoelectronic partial circuit approximately corresponds to the voltage drop U2 over the energy storage unit 132.

In an optoelectronic component 150, in which the electrode layers are electrically short-circuited, the equivalent circuit diagram of the organics has a low-ohmic electrical short-circuit resistance 152 ($R_{short}$), which is electrically in parallel to the diode 182, the capacitance 184, and the bulk resistance 186. In a short-circuited optoelectronic resistance, the electric current dissipates essentially via the short-circuit resistance 152 and therefore not through the diode 182, the capacitor 184, or the bulk resistance 186. A short-circuited optoelectronic component is therefore optically inactive and electrical charge is essentially no longer stored in the capacitor 184.

This means that if a short-circuit exists in one of the optoelectronic components, the energy stored in this optoelectronic component 150 is thus discharged via the short-circuit resistance 152 and the total voltage U3 of an optoelectronic partial circuit having the short-circuited optoelectronic component 150 decreases by this one threshold value voltage. In the case of an optoelectronic partial circuit having at least one short-circuited optoelectronic component 150, i.e., if the electrode layers of the short-circuited optoelectronic component are directly electrically connected to one another in at least one optoelectronic component and therefore the parasitic capacitance of the short-circuited optoelectronic component is essentially bypassed, the voltage drop U3 over the optoelectronic partial circuit which is electrically connected to the energy storage unit is less than the voltage drop U2 over the energy storage unit 132.

In the event of a short-circuit in one of the n optoelectronic components, i.e., with a number n–1 of perfect optoelectronic components and one short-circuited optoelectronic component, the short-circuited optoelectronic component discharges very rapidly via the short-circuit resistance 152 and the voltage applied after the electrical connection decreases by a single threshold voltage $U_{threshold}$. The number of the electrode resistances $R_{ITO}$ remains the same, however.

The energy stored in the energy store 132 thus changes approximately to the value of U3, whereby the energy stored in the energy storage unit 132 becomes less than in the case of an optoelectronic partial circuit without short-circuited optoelectronic component. The change of the energy stored in the energy storage unit from U2 to U3 can be detected by means of the detection unit 134.

In the case of optoelectronic components, which are electrically connected in series, having different threshold voltage, a summation is performed over the individual threshold voltages of the optoelectronic components electrically connected in series, to be able to ascertain the voltage U3. Optoelectronic components which are electrically connected in series having equal threshold voltage are considered hereafter solely for simpler illustration. The voltage U3 is also referred to as $U_{OLED}$ in the case of optoelectronic components which are designed as OLEDs.

If an optoelectronic component having a short-circuit is present, the energy stored in the affected partial circuit is thus less by the factor (n−1)/n than in the case of a perfect optoelectronic partial circuit without short-circuited optoelectronic component.

In other words:

Without supply of energy to the optoelectronic component, i.e., without energizing, the charged capacitor 184 of the optoelectronic component 180 discharges.

Energizing of the optoelectronic component is interrupted, for example, upon turning off of the optoelectronic assembly 100, for example, opening of a switch in the current path between the energy supply circuit 160 and the optoelectronic component 180.

For example, the optoelectronic assembly 100 includes a first blocking unit 140, for example, a switch, which is arranged in the current path between the energy source 110 and the at least one optoelectronic component 150, 180, as described in greater detail hereafter.

Furthermore, the energizing of the optoelectronic component can be interrupted, for example, in the case of a pulsed activation of the optoelectronic component, for example, a pulse-width modulation, a pulse-frequency modulation, and/or a pulse-amplitude modulation of the operating current of the optoelectronic component.

The voltage U3, which drops over the at least one intact optoelectronic component (illustrated in FIG. 1 as the optoelectronic component 180) settles after energizing and shutdown of the energy source ($U3_{off\_no\_short}$) at a value of $U3_{off\_no\_short} = n*U_{threshold}$, with the number n of (identical) optoelectronic components which are electrically connected in series, and the threshold voltage or forward voltage $U_{threshold}$ of the optoelectronic component or the identical optoelectronic components electrically connected in series.

If an optoelectronic component is short-circuited (illustrated as the optoelectronic component 150 in FIG. 1), the short-circuited optoelectronic component 150 does not discharge to $U_{threshold}$, but rather essentially to 0 V. The voltage U3, which drops over the partial circuit having a short-circuited optoelectronic component 150, thus settles at $U_{off\_short} = (n-1)*U_{threshold}$. In the event of x short-circuited optoelectronic components, the voltage settles at $U_{off\_short} = (n-x)*U_{threshold}$.

The energy supply partial circuit 120 is configured and electrically connected to the ascertainment circuit 130 such that a predefined amount of electrical energy is supplied in a high-ohmic manner to the energy storage unit 132, for example, by means of an electrical resistance 122 of the energy supply partial circuit 120 or to a third blocking element, for example, a switch, so that a predefined voltage U2 drops over the energy storage unit 132. The voltage U2, which drops over the energy storage unit 132, is greater than or equal to the threshold voltage of the intact optoelectronic components, for example, $U2 \geq (n-1)*U_{threshold}$ in the case of one short-circuited optoelectronic component in an optoelectronic partial circuit having a total of n optoelectronic components.

The predefined voltage U2 can, for example, in addition to $(n-1)*U_{threshold}$ optionally also include the value of the forward voltage of a second blocking unit 136 and the value of the voltage loss of a control device 190, which are described in greater detail hereafter.

Moreover, the predefined voltage U2 should be less than or equal to $n*U_{threshold}$, for example, U2 should be less than or equal to $n*U_{threshold}$ plus the threshold voltage of the second blocking unit 136 and the voltage loss of the control device 190.

In principle, U2 can also be somewhat greater than $n*U_{threshold}$, wherein the at least one optoelectronic component, for example, an OLED, is then optically active during the test, however, for example, is light-emitting.

As long as no optoelectronic component is short-circuited, the energy storage unit 132 does not discharge via the at least one optoelectronic component 180, for example, an OLED, and/or a second blocking unit 136, which is described in greater detail hereafter. This means the OLED remains off or optically inactive, respectively. If the voltage U2 is less than the threshold value voltage of the at least one optoelectronic component, the optoelectronic component itself is optically inactive in the intact state during the test or method.

However, if at least one optoelectronic component is electrically short-circuited, the voltage U3 of the partial circuit having the short-circuited optoelectronic component 150 sinks to a value which is less than the voltage U2, which drops over the energy storage unit 132, because this is greater than or equal to $(n-1)*U_{threshold}$, so that the energy storage unit 132 at least partially discharges. In the case of a second blocking unit 136 having a diode, this becomes electrically conductive, because U3 is less than U2.

The change of the energy stored in the energy storage unit 132 can be detected by means of the detection unit 134, for example, in the case of an energy storage unit 132 having a capacitor 132, for example, using a voltmeter in a voltage measurement circuit 134 or a comparator circuit 134.

The detection of the change of the energy stored in the energy storage unit 132 can be performed, for example, a discharge detection by voltage measurement at the capacitor 132, for example, in the form of exceeding or falling below a threshold value, or tracking of the stored energy over time. Alternatively or additionally, the discharge detection can be performed by current measurement at the capacitor 132, i.e., the discharge current and/or charge current of the capacitor 132 is detected. Alternatively or additionally, a discharge detection is indirectly possible by way of measurement of a current in the at least one optoelectronic partial circuit.

The change of the energy stored in the at least one optoelectronic component can be ascertained, for example, in the case of organic optoelectronic components by means of a comparison of the voltage drop over the organic optoelectronic components with respect to a voltage drop over at least one inorganic optoelectronic reference component. This comparison enables the setting of a "zero value", i.e., a configuration of a reference value even before the at least one organic optoelectronic component is put into operation. This can thus prevent a short-circuit, which already exists before the at least one optoelectronic component is put into operation, from remaining unrecognized. In addition, the influence of temperature and aging in the at least one organic optoelectronic component can be ascertained by means of the reference component. Alternatively, in a similar manner, a reference value can be stored as an electrical target value in an analysis unit.

This procedure in an optoelectronic component can be used as a test method for testing the optoelectronic assembly for electrical short-circuits. The test can be performed before the activation of the at least one optoelectronic component, for example, turning on of the at least one optoelectronic component, and also automatically in pulse-modulated operation of the optoelectronic component. Alternatively, the test can be performed upon turning off of the optoelectronic assembly, for example, in the automotive field upon turning off of the automobile light, which includes the optoelectronic assembly 100. Alternatively or additionally, the test method can be carried out once, multiple times, and/or regularly in one or multiple pulse pauses in the case of pulsed operation (PWM operation) of the optoelectronic assembly 100, for example, if it is part of a turn signal of a motor vehicle. It can thus be checked in a simple manner in the optoelectronic assembly 100 whether there is an electrical short-circuit in the optoelectronic assembly.

In various refinements, the optoelectronic assembly includes at least one blocking unit. A blocking unit is configured such that the current strength of the electrical current is settable and/or the current direction of the electrical current is settable. A blocking unit may include, for example, a switch and/or a diode, for example, a cost-effective N-MOSFET or NPN transistor as a switch. A blocking unit includes an input and an output. In the case of a diode as a blocking unit, the input is the anode and the output is the cathode of the diode.

In various refinements, at least one blocking unit, also referred to as a first blocking unit 140, is arranged in the current path of the at least one optoelectronic component with respect to the energy source 110. The output of the first blocking unit 140 is electrically connected to the input of the optoelectronic partial circuit and the input of the first blocking unit 140 is electrically connected to the first terminal of the energy supply circuit 160.

A switch of the first blocking unit 140 causes, in a first switching state, an electrical connection between the input of the optoelectronic partial circuit and the energy supply circuit 160 and is therefore closed in its first switching state, and suppresses this electrical connection in a second switching state and is therefore open in its second switching state.

A diode of the first blocking unit 140 causes a return flow of charge carriers into the energy supply circuit 160 to be prevented during the discharge of the energy storage unit 132 or the parasitic capacitance of the at least one optoelectronic component of the optoelectronic partial circuit. For example, the first blocking unit 140 includes a diode, the anode of which is electrically connected to the energy supply circuit 160 and the cathode of which is electrically connected to the ascertainment circuit 130 and/or the optoelectronic component.

In various refinements, a blocking unit, also referred to as a second blocking unit 136, is arranged in the current path between the energy storage unit 132 and at least one optoelectronic component.

The second blocking unit 136 enables, for example, coupling and decoupling of the ascertainment circuit 130 to or from a direct current path to the energy source 110 and/or the at least one optoelectronic component 180.

The output of the second blocking unit 136 is electrically connected to the input of at least one optoelectronic component and the input of the second blocking unit 136 is electrically connected to the output of the energy storage unit 132.

In various refinements, the second blocking unit 136 is configured to only conduct electrical current if the voltage U2, which drops over the energy storage unit 132, is greater than the voltage U3, which drops over the at least one optoelectronic component, which is electrically connected to the energy storage unit 132. Otherwise, the blocking unit 136 is in blocking operation, i.e., is electrically nonconductive.

A diode of the second blocking unit 136 has the effect that, in the event of discharge of the parasitic capacitance of the at least one optoelectronic component of the optoelectronic partial circuit 180 or in the event of closed first blocking unit 140, i.e., if electrical energy is supplied from the energy supply circuit 160 to the optoelectronic component, a flow of charge carriers into the energy storage unit 132 is prevented. For example, the second blocking unit 136 includes a diode, the anode of which is electrically connected to the energy storage unit 132 and the cathode of which is electrically connected to the optoelectronic partial circuit. The ascertainment circuit 130 is thus decoupled during the energizing of the at least one optoelectronic component. It can be ensured by means of the second blocking unit that the electrical voltage U3 is not measured in operation, because the ascertainment circuit 130 in operation of the at least one optoelectronic component is decoupled therefrom by means of the second blocking unit 136.

In other words: If the at least one optoelectronic component is energized, for example, by means of an electrical connection of the at least one optoelectronic component to the energy source 110, for example, by means of closing of a switch of the first blocking unit 140, the voltage U3 increases to a (forward) voltage value which is greater than the pre-charged energy, for example, the voltage U2, in the energy storage unit 132. In the case of a second blocking unit 136 in the form of a diode, the second blocking unit 136 is electrically nonconductive during this, because the diode is in reverse operation. The second blocking unit 136 (automatically) decouples the energy storage unit 132 from the at least one optoelectronic component or the at least one optoelectronic partial circuit.

In other words: By way of the design of the sensor circuit 170, the ascertainment circuit 130 is automatically decoupled in operation, i.e., during optical activity, of the at least one optoelectronic component and is automatically coupled when the optoelectronic component is turned off, i.e., during optical inactivity. A simple check or a simple test of the at least one optoelectronic component for short-circuits is thus enabled.

In various refinements, the second blocking unit 136 is designed as an active switch, for example, a transistor, whereby the above-described advantage can be achieved.

Therefore, by means of the second blocking unit 136, (automatic) coupling or decoupling of the ascertainment circuit in the optically inactive or optically active state, respectively, of the at least one optoelectronic component can be enabled.

Alternatively or additionally, a blocking unit, also referred to as a third blocking unit, is arranged in the current path between the energy supply partial circuit 120 and the energy storage unit 132.

The third blocking unit is configured, for example, for opening and closing the electrical connection or for changing the connection from electrically conductive to electrically nonconductive, and vice versa.

For example, the energy supply partial circuit 120 includes a high-ohmic electrical resistance 122 and a Zener diode 124. The electrical resistance 122 includes an input and an output. The input of the electrical resistance 122 is electrically connected to the energy source 110 and the output of the electrical resistance 122 is electrically connected to the cathode of the Zener diode 124. The anode of the Zener diode 124 is electrically connected to the first output of the energy supply partial circuit 120 or corresponds thereto. The input of the energy storage unit 132 is therefore electrically connected to the output of the electrical resistance 122 and the cathode of the Zener diode 124. By means of the Zener voltage or breakdown voltage of the Zener diode 124, for example, the voltage U2, which drops over the energy storage unit 132, can be set. The energy supply of the ascertainment circuit 130 is thus settable, for example.

In one refinement, the optoelectronic assembly 100 includes an analysis unit, which is configured to ascertain, depending on the detected change of the energy stored in the energy storage unit 132, whether the at least one optoelectronic component 180 includes a short-circuit. The analysis unit, for example, a computer unit, can be connected, for example, to the detection unit 134.

In one refinement, the optoelectronic assembly 100 includes at least one control device 190, for example, a linear regulator, a clocked regulator, or a switch, for regulating or controlling the energy supplied to the at least one optoelectronic component 150, 180. The control device 190 includes an input and an output.

The analysis unit can be electrically connected to the control device, for example. Thus, for example, individual optoelectronic components or optoelectronic partial circuits can be switched to optically inactive or optically active.

In various refinements, two or more optoelectronic partial circuits each include at least one control device 190 (illustrated in the figures as 190-1, 190-2).

Alternatively or additionally, a control device 190 is electrically connected to two or more optoelectronic partial circuits to activate them.

Figure 2:
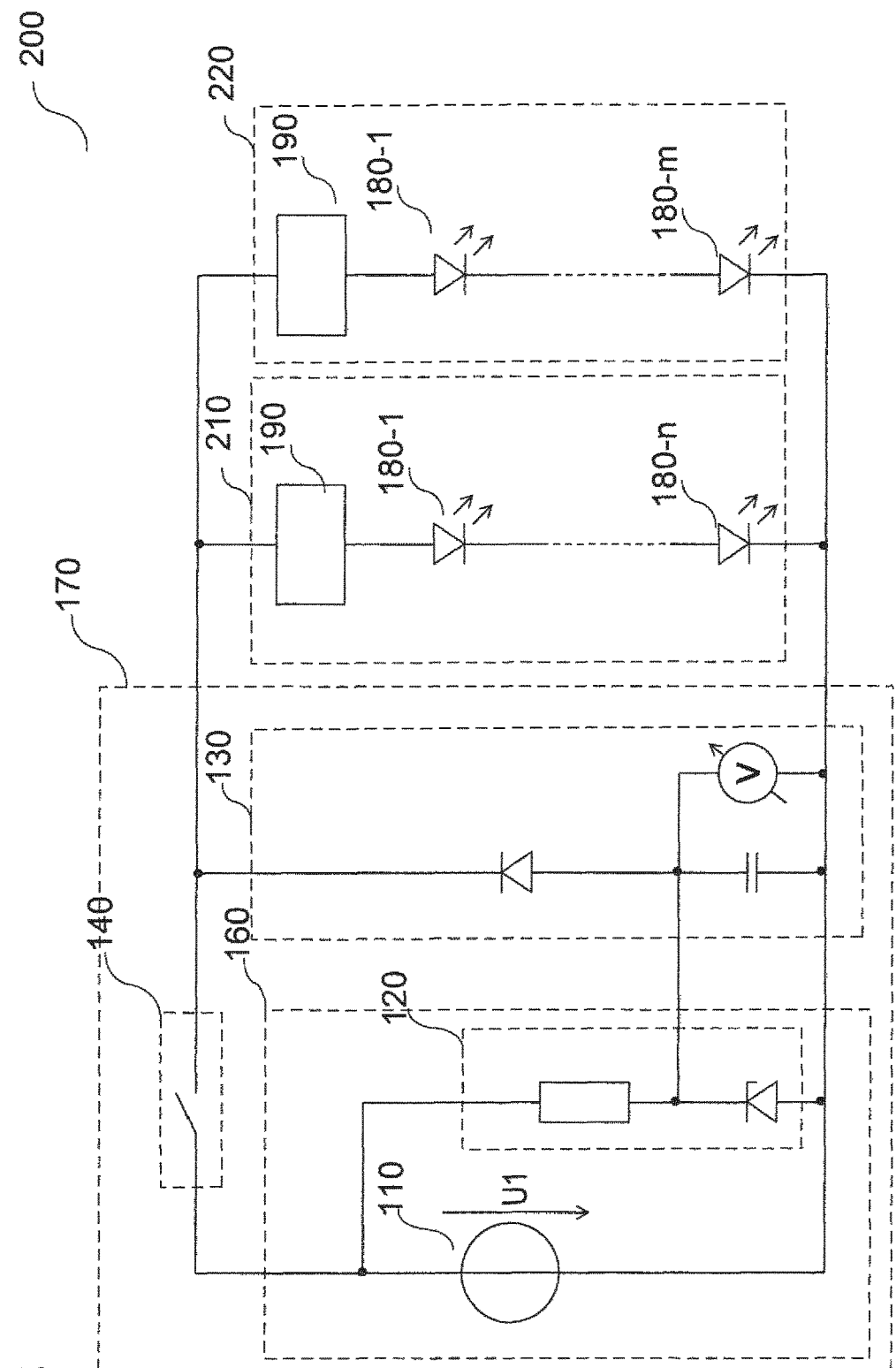
FIG. 2 shows a circuit diagram of an embodiment of an optoelectronic assembly.

In various refinements of an optoelectronic assembly 200, a control device 190 for controlling and/or regulating the operating current of at least one optoelectronic component is arranged on the anode side of the at least one optoelectronic component (high-side control), illustrated by way of example in FIG. 2.

Figure 3:
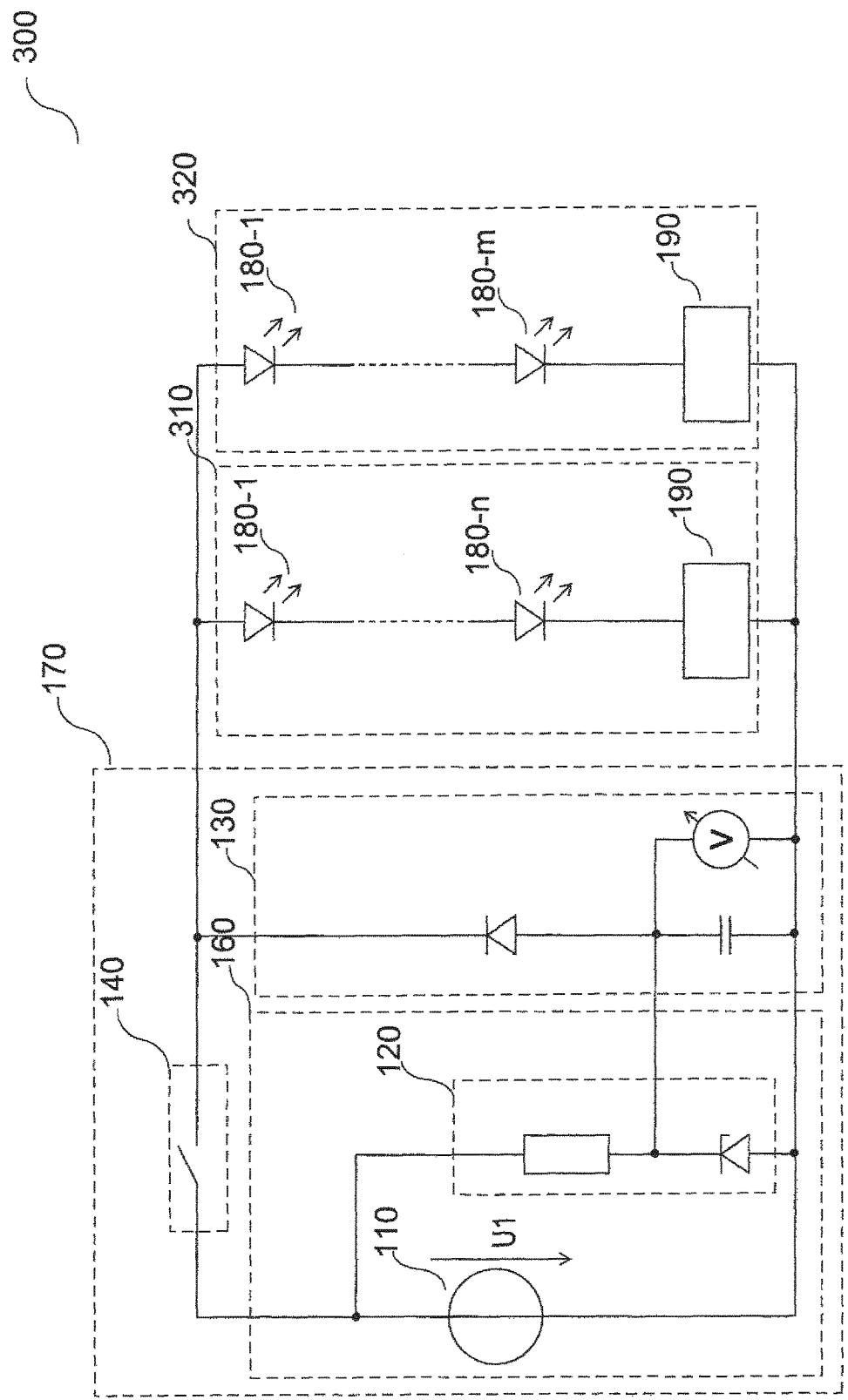
FIG. 3 shows a circuit diagram of an embodiment of an optoelectronic assembly.

In various refinements of an optoelectronic assembly 300, a control device 190 for controlling and/or regulating the operating current of at least one optoelectronic component is arranged on the cathode side of the at least one optoelectronic component (low-side control), illustrated by way of example in FIG. 3.

Independently of the arrangement of the linear regulator 190, the change of the energy stored in the energy storage unit 132 can be detected in relation to ground.

Furthermore, FIG. 2 and FIG. 3 illustrate that the optoelectronic assembly 200, 300, which can largely correspond to the optoelectronic assembly 100 shown in FIG. 1, for example, may include, in various refinements, more than one optoelectronic component 180-1, 180-$n$ and/or more than one optoelectronic partial circuit 210, 220 or 310, 320, respectively.

In various refinements, the optoelectronic assembly includes at least one first energy source and one second energy source, wherein the first energy source is electrically connected to at least one first optoelectronic partial circuit and the second energy source is electrically connected to at least one second optoelectronic partial circuit, wherein the first energy source is different from the second energy source. In order that the energy storage unit can discharge via the second blocking unit 132, the optoelectronic partial circuits 210, 220 or 310, 320 include a common ground connection, i.e., the first energy source and the second energy source include at least one common terminal. In various refinements, at least one optoelectronic partial circuit may include an energy source for energizing the at least one optoelectronic component of the optoelectronic partial circuit.

In various refinements, the optoelectronic assembly includes at least one first optoelectronic partial circuit 210, 310 and one second optoelectronic partial circuit 220, 320, wherein the first optoelectronic partial circuit 210, 310 is electrically in parallel to the second optoelectronic partial circuit 220, 320. The first optoelectronic partial circuit 210, 310 includes an input and an output, which are referred to in this context as the first input and as the first output, respectively. The second optoelectronic partial circuit 220, 320 includes a second input and a second output. The first input and the second input are electrically connected to the first terminal of the energy supply circuit 160 and the output of the energy storage unit 132. In addition, the first input is electrically connected to the second input. Optionally, the first input and the second input are electrically connected to the output of the first blocking unit 140 and/or the second blocking unit 136.

The first optoelectronic partial circuit 210, 310 and the second optoelectronic partial circuit 220, 320 each include at least one optoelectronic component 180, for example, respectively n or m optoelectronic components, wherein n or m is a whole number and identifies an individual optoelectronic component. For example, with n or m optoelectronic components, the first optoelectronic component is identified with 180-1 and the nth or mth optoelectronic component is identified with 180-$n$ or 108-$m$, respectively. The optoelectronic partial circuits may include identical or different optoelectronic components and may include an equal or a different number of optoelectronic components.

Similarly, the first optoelectronic partial circuit may include a first control device 190-1 and the second optoelectronic partial circuit may include a second control device 190-2, wherein the first control device 190-1 and the second control device 190-2 can be identical or different. For simpler illustration, the control devices 190-1, 190-2 of the partial circuits are identified as the control device 190.

Furthermore, FIG. 2 and FIG. 3 illustrate that the energy storage unit 132 can be electrically connected to two or more optoelectronic partial circuits 210, 220 or 310, 320. This intrinsic OR-linkage already enables, in the case of multiple electrically parallel optoelectronic partial circuits 210, 220 or 310, 320, the establishment of an electrical short-circuit of an optoelectronic component in one of the optoelectronic partial circuits. Monitoring of multiple optoelectronic partial circuits 210, 220 or 310, 320 is thus already possible using only one ascertainment circuit 130.

If the optoelectronic components do not include a short-circuit, the intrinsic capacitors thereof thus discharge after the interruption of the electrical connection of the optoelectronic partial circuit to the energy supply circuit 160, for example, after the opening of the first blocking unit 140, via the intrinsic bulk resistances thereof up to the threshold value voltages thereof, wherein the individual threshold value voltages add up to a total voltage over the respective optoelectronic partial circuit. The total voltage thus corresponds to a total of the individual voltages. In other words: because of the intrinsic capacitors, a residual amount of energy remains stored in the optoelectronic components, which is measurable as the total voltage.

In one refinement, the energy storage unit 132 and the energy supply circuit 160 are designed such that the electrical voltage U2 which drops over the energy storage unit 132 is less than or is approximately equal to the total threshold voltage U3 of the optoelectronic components, which are electrically connected to one another in series and are electrically conductively connected to the energy storage unit 132.

Alternatively or additionally, the energy storage unit 132 and the energy supply circuit 160 are designed such that the electrical voltage U2 which drops over the energy storage unit is greater than or is approximately equal to the total threshold voltage U3 after energizing or shutdown of the energy source of the optoelectronic components, which are electrically connected to one another in series and are electrically conductively connected to the energy storage unit 132, wherein at least one of the electrically conductively connected optoelectronic components includes an electrical short-circuit. The threshold voltage of a short-circuited optoelectronic component is approximately 0 V. The voltage which drops over the energy storage unit is therefore greater than or approximately equal to the total threshold voltage U3 of the intact optoelectronic components.

In various refinements, the first optoelectronic partial circuit and the second optoelectronic partial circuit each include a switch, for example, integrated into the control device 190. The respective optoelectronic partial circuit can be electrically disconnected from the energy source 110 by means of the switch.

Accurate identification of electrical short-circuits in the first optoelectronic partial circuit and/or the second optoelectronic partial circuit is thus possible.

The switches can be arranged, for example, in relation to ground on the cathode side of the at least one optoelectronic component of the respective optoelectronic partial circuit.

Alternatively or additionally, for example, a high-ohmic switchable linear regulator 190-1, 190-2 can be provided as a control device 190 in the respective optoelectronic partial circuit 210, 220 or 310, 320. Thus, for example, measured values of the individual optoelectronic partial circuits can be detected and compared and thus redundancy can be provided and/or aging and/or temperature influences can be compensated for.

Figure 4:
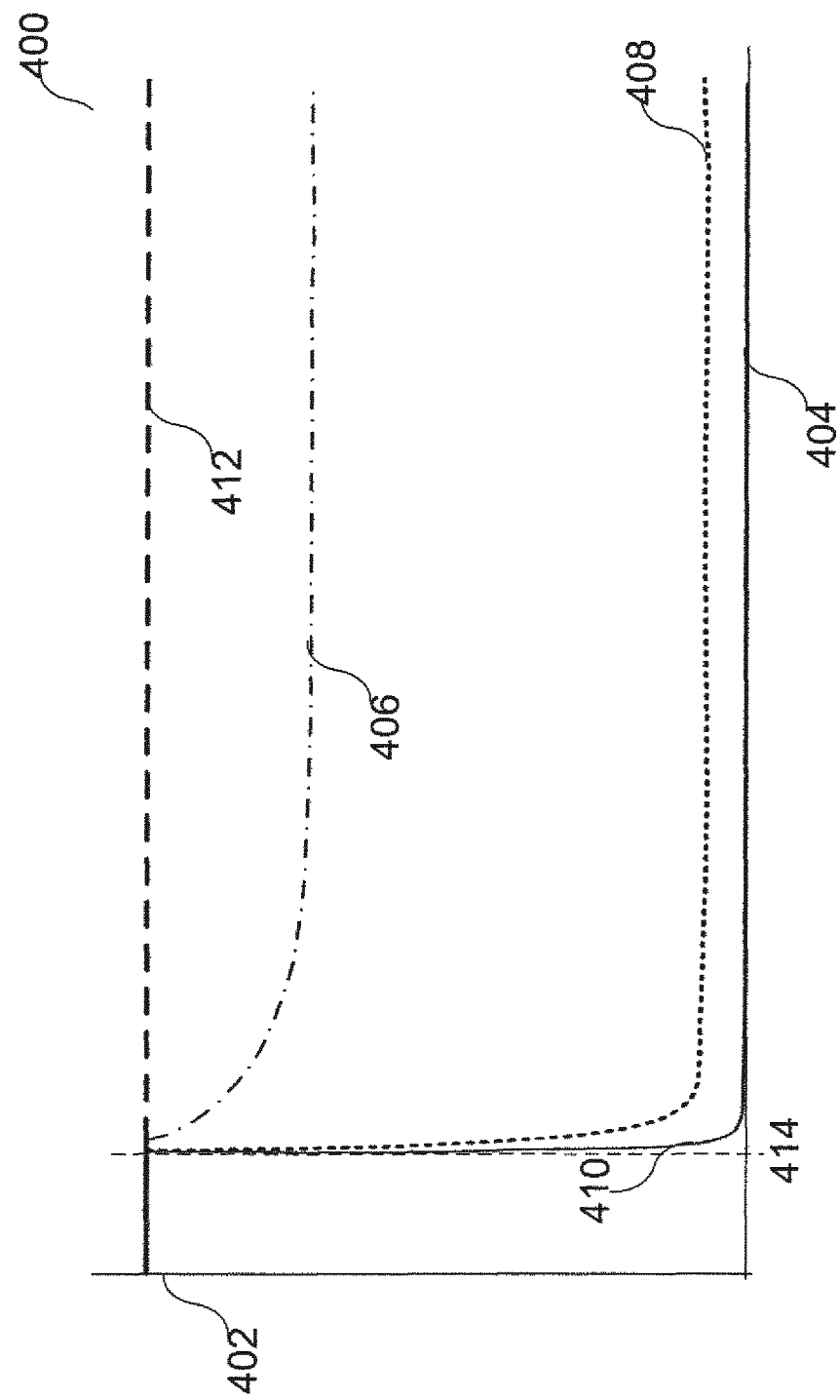
FIG. 4 shows a diagram having exemplary curves of voltages.

FIG. 4 shows a diagram 400 having exemplary curves of voltages, which are detected by a detection unit of an optoelectronic assembly, which can largely correspond, for example, to the optoelectronic assembly 200 or 300 shown in FIG. 2 or FIG. 3, respectively. The arrangement of the control device as a high-side control or low-side control has no qualitative influence on the detectable signal.

The optoelectronic assembly includes three optoelectronic partial circuits, which are electrically connected in parallel, each having an organic light-emitting diode as an optoelectronic component. The optoelectronic component of one of the optoelectronic partial circuits is assumed to be short-circuited, by assuming the voltage curve detectable at the energy storage unit for different resistance values of the short-circuit resistance of the optoelectronic partial circuit.

The electrical voltage 402 (V) is shown as a function of the time 404 (ms) for different short-circuit resistances 152 (see description of FIG. 1) in the diagram 400. The exemplary voltage curve 412 over the capacitor of an energy storage unit is shown, which can be ascertained by a detection unit, for example, by a voltmeter connected in parallel. The optoelectronic partial circuits are activated, for example, in a pulse-modulated manner. The capacitor of the energy storage unit discharges in the time between pulses (pulse pauses) in the case of a short-circuited optoelectronic component.

The voltage curve is shown for intact optoelectronic partial circuits, for which a resistance value of the short-circuit resistance of 10 MΩ is assumed. Furthermore, the exemplary voltage curves 406, 408, 410 are shown for a short-circuited optoelectronic partial circuit, for which a resistance value of the short-circuit resistance of 1 kΩ (406), 100Ω (408), 20Ω (410) is assumed.

Up to the point in time 414, the optoelectronic assembly is energized, this means the optoelectronic partial circuits are in operation, i.e., are optically active or supplied with energy. During this time, the voltage 402 corresponds to the value of the voltage U2 predefined by the energy supply partial circuit 120, independently of whether or not a short-circuit is present in one of the optoelectronic partial circuits, because the diode of the second blocking unit 136 is in blocking operation, because the operating voltage of the OLEDs is greater than the voltage U2.

At the point in time 414, the energizing of the optoelectronic partial circuits is interrupted, for example, in the case of a pulsed activation. Without short-circuit (412), the capacitor of the energy storage unit does not discharge. With short-circuit, the capacitor of the energy storage unit discharges (406, 408, 410). A drop of the voltage 402 with the time 404 is apparent from the diagram, wherein the voltage drops more deeply and rapidly the lower the resistance value of the short-circuit resistance is.

Figure 5:
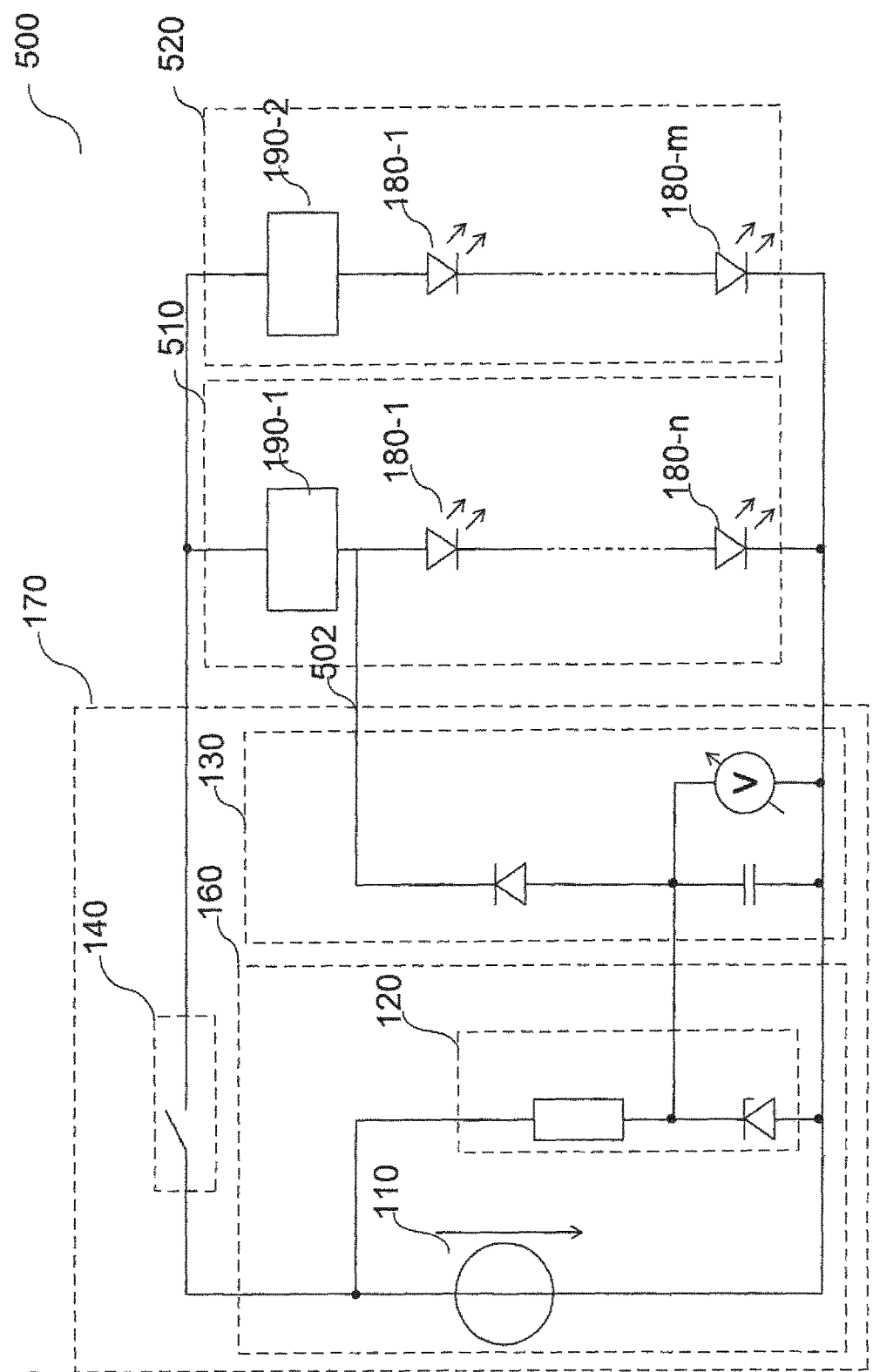
FIG. 5 shows a circuit diagram of an embodiment of an optoelectronic assembly.

FIG. 5 shows a circuit diagram of an embodiment of an optoelectronic assembly, which can largely correspond, for example, to the optoelectronic assembly 200 or 300 shown in FIG. 2 or FIG. 3, respectively. In contrast to the optoelectronic assemblies 200, 300 illustrated in FIG. 2 and FIG. 3, respectively, the output of the energy storage unit 132 or the output of the second blocking unit 136 is electrically connected to the output of a control device 190-1 and is electrically connected to the input of an optoelectronic component 180-1 of only one optoelectronic partial circuit 510 of the multiple optoelectronic partial circuits 510, 520 (illustrated in FIG. 5 by means of the electrical connection 502). In various refinements, with suitable control device, all optoelectronic partial circuits are monitored for short-circuits. The control device has the property, for example, that a current can flow from "bottom to top", i.e., a current flow from the direction of the optoelectronic components into and through the control device is possible. If a short-circuit is present in the first optoelectronic partial circuit 510, the capacitor of the energy storage unit 132 discharges and the short-circuit is detected by means of the change of the stored energy. If a short-circuit is present in the second optoelectronic partial circuit 520, the total voltage in the second optoelectronic partial circuit 520 is less because of the short-circuit than in the first optoelectronic partial circuit 510. The capacitance of the first optoelectronic partial circuit 510 discharges via the control device 190-1 of the first optoelectronic partial circuit. The voltages which drop over the optoelectronic partial circuits 510, 520 thus equalize. The voltage at the optoelectronic partial circuit 510 with the diode of the second blocking unit 136 therefore also decreases. The diode becomes electrically conductive and causes the capacitor of the energy storage unit 132 to discharge.

Figure 6:
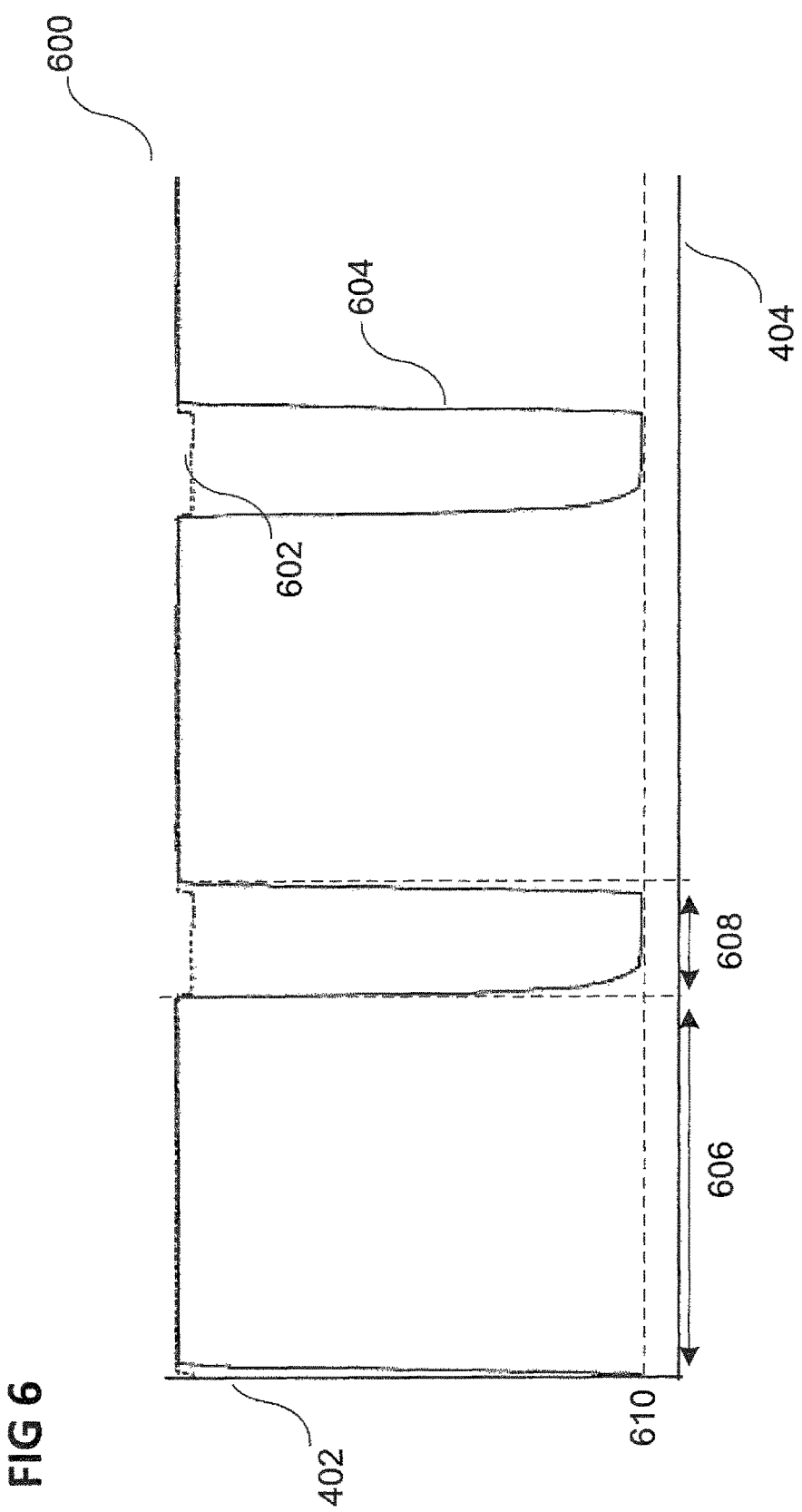
FIG. 6 shows a diagram having exemplary curves of voltages.

FIG. 6 shows a diagram 600 having exemplary curves of voltages of the capacitor of the energy storage unit 132 similar to the activation circuit illustrated in the diagram 400 in FIG. 4, for the case 602 of an intact optoelectronic partial circuit ($R_{Short}$=10 MΩ) and the case 604 of a short-circuited optoelectronic partial circuit ($R_{Short}$=20Ω).

During a first time 606, the optoelectronic partial circuits are energized, so that the second blocking element 136 is nonconductive and the voltage U2 drops over the capacitor. During the second time 608, the activation of the optoelectronic partial circuits has pulse pauses, in which the optoelectronic partial circuits are not energized. In the second time 608, the second blocking element 136 can become electrically conductive in the event of a short-circuit in one of the optoelectronic partial circuits, and a voltage drop over the capacitor of the energy storage unit, i.e., a discharge of the capacitor or a change of the energy stored in the energy storage unit, can be detected.

The diagram 600 illustrates a short-circuit in an optoelectronic partial circuit, which is directly electrically connected to the energy storage unit (illustrated in FIG. 5 by means of the connecting line 502). A qualitatively very similar diagram can be detected at the energy storage unit, if the short-circuit should occur in the optoelectronic partial circuit, which is not directly connected to the energy storage unit. The minimum value 610 of the discharge voltage changes depending on the short-circuit resistance $R_{Short}$ (see FIG. 1) and depending on whether the short-circuit is in the optoelectronic partial circuit directly connected to the energy storage unit. The minimum value 610 can be lower in the event of a short-circuit in the optoelectronic partial circuit directly connected to the energy storage unit than in the event of a short-circuit in the optoelectronic partial circuit which is not directly connected to the energy storage unit.

The test of an optoelectronic assembly for short-circuits is therefore also possible if only a part of the optoelectronic partial circuits is monitored. The sensitivity of the measurement, i.e., how clearly visible the detected change of the energy stored in the energy storage unit is, is dependent on the control device 190 used, for example, the linear regulator used, for example, on the internal construction of the linear regulator.

Figure 7:
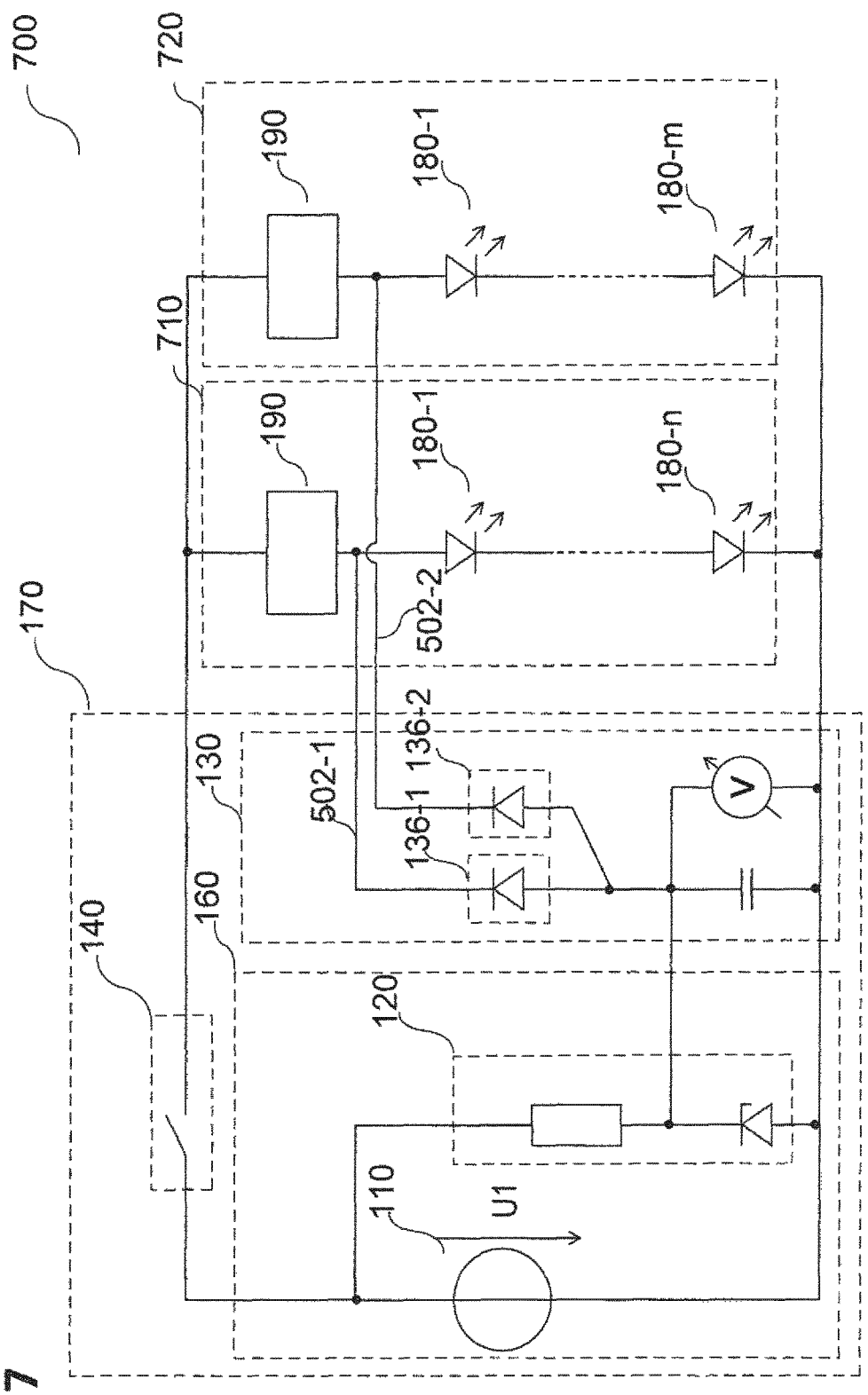
FIG. 7 shows a circuit diagram of an embodiment of an optoelectronic assembly.

FIG. 7 shows a circuit diagram of an embodiment of an optoelectronic assembly, which can largely correspond, for example, to the optoelectronic assembly 200, 300, or 500 shown in FIG. 2, FIG. 3, or FIG. 5, respectively. In contrast to these optoelectronic assemblies 200, 300, and 500, the ascertainment circuit includes multiple second blocking units (illustrated in FIG. 7 as blocking unit 136-1 and blocking unit 136-2), the input of which is connected to the output of the energy storage unit 132 and the output of which is electrically connected to different optoelectronic components and/or optoelectronic partial circuits in each case (illustrated in FIG. 7 by means of the electrical connections 502-1, 502-2). In various refinements, therefore, all or at least a part of the optoelectronic partial circuits are individually monitored for short-circuits.

Figure 8:
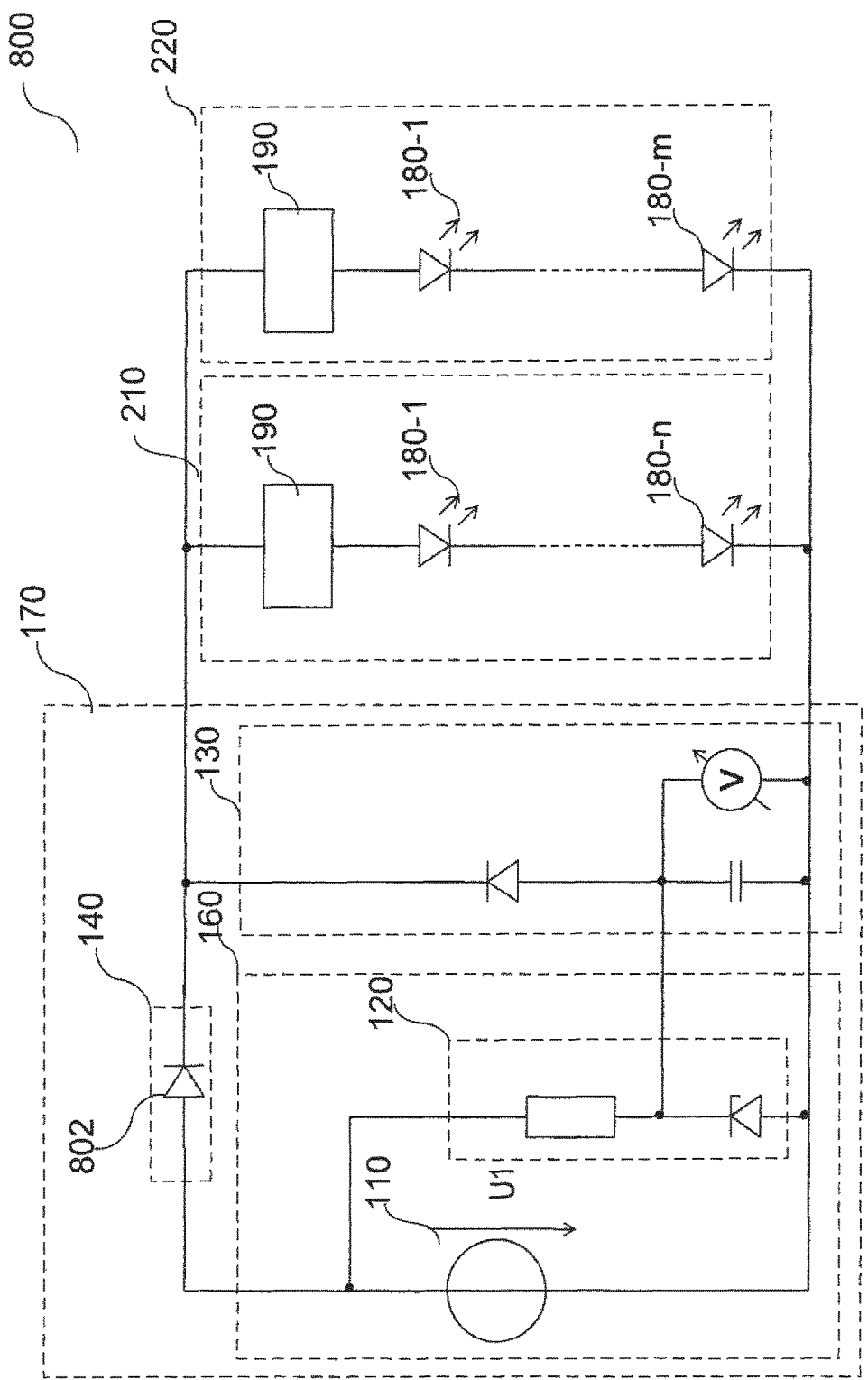
FIG. 8 shows a circuit diagram of an embodiment of an optoelectronic assembly.

FIG. 8 shows a circuit diagram of an embodiment of an optoelectronic assembly 800, which can largely correspond to the optoelectronic assembly 200 shown in FIG. 2, for example. In contrast to the optoelectronic assembly 200 illustrated in FIG. 2, the first blocking unit 140 of the optoelectronic assembly 800, additionally or alternatively to the switch of the optoelectronic assembly 200 of FIG. 2, includes a diode 802, the anode of which is electrically connected to the first terminal of the energy source 110 and the cathode of which is electrically connected to the input of at least one optoelectronic partial circuit. In various refinements, a low-ohmic energy source 110 can thus be used, because the diode of the first blocking unit 140 prevents a flow of charge carriers into the energy source 110.

This means the energy source 110 and the energy storage unit 132 are decoupled by means of the diode 802 of the first blocking unit 140, so that the energy storage unit 132 does not discharge via the energy source 110. This is helpful, for example, if a shutdown of the optoelectronic components does not occur via a switch of the first blocking unit 140, but rather via switching the driver circuit of the optoelectronic components to inactive, for example, switching the energy source 110 to inactive. An energy source 110 which is switched to inactive cannot contain sufficient high-ohmic current paths, which would cause an undesired discharge of the energy storage unit 132 without a diode of the first blocking unit 140.

FIG. 9 shows a flow chart for a method for operating an optoelectronic assembly. The optoelectronic assembly can largely correspond, for example, to an optoelectronic assembly shown above. In other words: The method can be executed on one of the optoelectronic assemblies explained above.

The method 900 includes supplying 902 electrical energy to the energy storage unit by means of the energy supply circuit.

The method furthermore includes detecting 904 the stored electrical energy in the energy storage unit by means of the detection unit, for example, at at least one first time and one second time or with respect to a predefined target value, for example, a voltage drop over a reference component, a value stored in an analysis unit, or the value of the stored energy at the first time.

The method additionally includes ascertaining 906 a change of the stored electrical energy detected in the energy storage unit.

The advantages and refinements mentioned with reference to the optoelectronic assembly can readily be transferred to corresponding advantages and refinements of the method. The energy supply circuit can be, for example, a driver circuit, can be referred to as a driver circuit, or can be a part of a driver circuit.

According to one refinement, it is recognized that the optoelectronic partial circuit includes the short-circuit, if the absolute value of the detected change of the energy stored in the energy storage unit is greater than or at least approximately greater than zero, and it is recognized that the optoelectronic partial circuit does not include a short-circuit if the absolute value of the detected change of the energy stored in the energy storage unit is equal to zero. This contributes to recognizing the short-circuit in a simple manner if the optoelectronic assembly or an optoelectronic partial circuit only includes one optoelectronic component.

According to one refinement, the detected stored energy, for example, of the first time, is compared to a predefined target value, which is greater than zero. It is recognized that at least one optoelectronic component includes a short-circuit at the first time if the energy stored in the energy storage unit which is detected at the first time is less than the predefined target value. It is recognized that no optoelectronic component includes a short-circuit if the energy stored in the energy storage unit which is detected at the first time is equal or at least approximately equal to the predefined target value. This contributes to recognizing the short-circuit in a simple manner, if the optoelectronic partial circuit and/or the optoelectronic assembly include two, three, or more optoelectronic components. The predefined target value can be, for example, the value of the predefined voltage U2 and the threshold value voltage or forward voltage can correspond to the n−1 intact optoelectronic components, which are collectively electrically connected in series to the energy storage unit, with decoupled energy supply circuit. The target value can be empirically ascertained, stored, and then predefined, for example.

According to one refinement, the electrical connection of the energy storage unit to the at least one optoelectronic component is interrupted by means of a blocking unit of the ascertainment circuit, if energy is supplied to the at least one optoelectronic component directly from the energy supply circuit, wherein the blocking unit is arranged in the current path between the energy storage unit and the at least one optoelectronic component.

The electrical connection can be interrupted, for example, by electrically conductively connecting the at least one optoelectronic component to the energy supply circuit or interrupting the electrical connection of the energy storage unit to the at least one optoelectronic component by means of a switch.

This enables the ascertainment circuit to be coupled or decoupled to or from the at least one optoelectronic component, respectively.

According to one refinement, the optoelectronic assembly includes at least one partial circuit having a single optoelectronic component and the energy stored in the energy storage unit is predefined so that the voltage which drops over the energy storage unit is less than essentially the threshold value voltage of the optoelectronic component.

According to one refinement, the optoelectronic assembly includes at least one partial circuit having a first optoelectronic component and a second optoelectronic component, which are electrically connected to one another in series, and the energy stored in the energy storage unit is predefined so that the voltage which drops over the energy storage unit is less than essentially the total threshold value voltage of the at least one first optoelectronic component and second optoelectronic component and is greater than essentially the threshold value voltage of at least the first optoelectronic component or the second optoelectronic component.

The present disclosure is not restricted to the indicated embodiments. For example, the optoelectronic partial circuits shown can each more or fewer optoelectronic components. Furthermore, the optoelectronic assembly 100 may include one, two, or multiple further optoelectronic partial circuits. Furthermore, the embodiments can be combined with one another. For example, inorganic optoelectronic components can be used in all embodiments.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

LIST OF REFERENCE NUMERALS optoelectronic assembly 100, 200, 300, 500, 700, 800
electrical energy source 110
energy supply partial circuit 120
electrical resistance 122
Zener diode 124
ascertainment circuit 130
energy storage unit 132
detection unit 134
(second) blocking unit 136
first blocking unit 140
optoelectronic component 150, 180
short-circuit resistance 152
energy supply circuit 160
sensor circuit 170
diode 182
capacitor 184
bulk resistance 186
resistance 188
control device 190
partial circuit 210, 310, 510, 710
partial circuit 220, 320, 520, 720
electrical voltage U2
threshold voltage U3
diagram 400
voltage 402
time 404
voltage curve 406, 408, 410, 412
point in time 414
electrical connection 502
differentiating case 602, 604
time 606, 608
minimum value 610
diode 802
method 900
method steps 902, 904, 906

The invention claimed is:

1. An optoelectronic assembly, comprising:
at least one optoelectronic component, and
a sensor circuit, comprising:
   at least one energy supply circuit including an electrical energy source and an energy supply partial circuit; and
   an ascertainment circuit having at least one energy storage unit and a detection unit,
wherein the ascertainment circuit and the at least one optoelectronic component are electrically connected to one another in parallel;
wherein the at least one energy supply circuit is configured to supply electrical energy to the at least one optoelectronic component and the energy storage unit, wherein, by means of the electrical energy source and the energy supply partial circuit, the energy stored in the energy storage unit is supplied independently of the electrical energy supplied to the at least one optoelectronic component; and
wherein the detection unit is configured to detect a change of the electrical energy stored in the energy storage unit depending on a change of the energy stored in the at least one optoelectronic component.

2. The optoelectronic assembly as claimed in claim 1, wherein the at least one optoelectronic component is an organic light-emitting diode.

3. The optoelectronic assembly as claimed in claim 1, wherein the energy storage unit comprises at least one capacitor and the detection unit comprises at least one voltmeter, which is electrically connected in parallel to at least one capacitor of the energy storage unit.

4. The optoelectronic assembly as claimed in claim 1, wherein the ascertainment circuit further comprises: a blocking unit, which is arranged in the current path between the energy storage unit and the at least one optoelectronic component.

5. The optoelectronic assembly as claimed in claim 1, further comprising:
at least one control device, a clocked regulator, or a switch, for regulating or controlling the energy supplied to the at least one optoelectronic component.

6. The optoelectronic assembly as claimed in claim 1, further comprising:
at least one first optoelectronic partial circuit having at least one optoelectronic component and one second optoelectronic partial circuit having at least one optoelectronic component, wherein the first optoelectronic partial circuit is electrically connected in parallel to the second optoelectronic partial circuit.

7. The optoelectronic assembly as claimed in claim 1, further comprising:
at least one optoelectronic partial circuit having a first optoelectronic component and a second optoelectronic component, which are electrically connected to one another in series.

8. The optoelectronic assembly as claimed in claim 6, wherein the energy storage unit and the energy supply circuit are designed such that the electrical voltage which drops over the energy storage unit is less than or is approximately equal to the total threshold voltage of the optoelectronic components which are electrically connected to one another in series and are electrically conductively connected to the energy storage unit.

9. The optoelectronic assembly as claimed in claim 8, wherein the energy storage unit and the energy supply circuit are designed such that the electrical voltage which drops over the energy storage unit is greater than or is approximately equal to the total threshold voltage of the optoelectronic components, which are electrically connected to one another in series and are electrically conductively connected to the energy storage unit, wherein at least one of the electrically conductively connected optoelectronic components comprises an electrical short-circuit.

10. The optoelectronic assembly as claimed in claim 1, further comprising:
an analysis unit, which is configured to ascertain, depending on the detected change of the energy stored in the energy storage unit, whether the at least one optoelectronic component comprises a short-circuit.

11. A method for operating an optoelectronic assembly, the optoelectronic assembly comprising:
at least one optoelectronic component, and
a sensor circuit, comprising:
at least one energy supply circuit including an electrical energy source and an energy supply partial circuit; and
an ascertainment circuit having at least one energy storage unit and a detection unit,
wherein the ascertainment circuit and the at least one optoelectronic component are electrically connected to one another in parallel;
wherein the at least one energy supply circuit is configured to supply electrical energy to the at least one optoelectronic component and the energy storage unit, wherein, by means of the electrical energy source and the energy supply partial circuit, the energy stored in the energy storage unit is supplied independently of the electrical energy supplied to the at least one optoelectronic component; and
wherein the detection unit is configured to detect a change of the electrical energy stored in the energy storage unit depending on a change of the energy stored in the at least one optoelectronic component;
the method comprising:
supplying electrical energy to the energy storage unit by means of the energy supply circuit;
detecting the stored electrical energy in the energy storage unit by means of the detection unit; and
ascertaining a change of the stored electrical energy detected in the energy storage unit.

12. The method as claimed in claim 11,
wherein the detected stored energy of the first time is compared to a predefined target value, which is greater than zero.

13. The method as claimed in claim 11,
wherein the electrical connection of the energy storage unit to the at least one optoelectronic component is interrupted by means of a blocking unit of the ascertainment circuit, if energy is supplied to the at least one optoelectronic component directly from the energy supply circuit, wherein the blocking unit is arranged in the current path between the energy storage unit and the at least one optoelectronic component.

14. The method as claimed in claim 11,
wherein the optoelectronic assembly comprises at least one partial circuit having a single optoelectronic component and the energy stored in the energy storage unit is predefined so that the voltage which drops over the energy storage unit is less than essentially the threshold value voltage of the optoelectronic component.

15. The method as claimed in claim 11,
wherein the optoelectronic assembly comprises at least one partial circuit having a first optoelectronic component and a second optoelectronic component, which are electrically connected to one another in series, and the energy stored in the energy storage unit is predefined so that the voltage which drops over the energy storage unit is less than essentially the total threshold value voltage of the at least one first optoelectronic component and second optoelectronic component and is greater than essentially the threshold value voltage of at least the first optoelectronic component or the second optoelectronic component.

16. The optoelectronic assembly as claimed in claim 5, wherein the at least one control device is a linear regulator.

17. The optoelectronic assembly as claimed in claim 7, wherein the energy storage unit and the energy supply circuit are designed such that the electrical voltage which drops over the energy storage unit is less than or is approximately equal to the total threshold voltage of the optoelectronic components which are electrically connected to one another in series and are electrically conductively connected to the energy storage unit.

18. The optoelectronic assembly as claimed in claim 17, wherein the energy storage unit and the energy supply circuit are designed such that the electrical voltage which drops over the energy storage unit is greater than or is approximately equal to the total threshold voltage of the optoelectronic components, which are electrically connected to one another in series and are electrically conductively connected to the energy storage unit, wherein at least one of the electrically conductively connected optoelectronic components comprises an electrical short-circuit.

* * * * *